(12) United States Patent
Lee et al.

(10) Patent No.: US 10,276,376 B2
(45) Date of Patent: Apr. 30, 2019

(54) MULTI-PATTERNING METHOD AND DEVICE FORMED BY THE METHOD

(71) Applicant: TAIWAN SEMICONDUCTOR MANUFACTURING CO., LTD., Hsin-Chu (TW)

(72) Inventors: Chia-Ying Lee, New Taipei (TW); Jyu-Horng Shieh, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 167 days.

(21) Appl. No.: 14/636,219

(22) Filed: Mar. 3, 2015

(65) Prior Publication Data
US 2015/0179450 A1 Jun. 25, 2015

Related U.S. Application Data

(62) Division of application No. 13/737,192, filed on Jan. 9, 2013, now Pat. No. 8,987,142.

(51) Int. Cl.
*H01L 21/311* (2006.01)
*H01L 21/033* (2006.01)
*H01L 21/768* (2006.01)

(52) U.S. Cl.
CPC ...... *H01L 21/0337* (2013.01); *H01L 21/0332* (2013.01); *H01L 21/31111* (2013.01); *H01L 21/31144* (2013.01); *H01L 21/76816* (2013.01); *Y10S 438/947* (2013.01)

(58) Field of Classification Search
USPC .......................................................... 438/694
See application file for complete search history.

(56) References Cited

U.S. PATENT DOCUMENTS

| | | | | |
|---|---|---|---|---|
| 6,022,815 | A * | 2/2000 | Doyle | H01L 21/0337 257/E21.038 |
| 6,835,662 | B1 * | 12/2004 | Erhardt | H01L 21/0337 257/E21.038 |
| 7,871,909 | B1 | 1/2011 | Wang et al. | |
| 8,987,142 | B2 * | 3/2015 | Lee | H01L 21/76816 430/313 |
| 2006/0234165 | A1 * | 10/2006 | Kamigaki | H01L 21/0337 430/313 |
| 2007/0238053 | A1 * | 10/2007 | Hashimoto | H01L 21/0337 430/313 |
| 2008/0070165 | A1 * | 3/2008 | Fischer | H01L 21/0338 430/314 |
| 2009/0117739 | A1 * | 5/2009 | Shin | H01L 21/0334 438/690 |

(Continued)

*Primary Examiner* — Caleb E Henry
(74) *Attorney, Agent, or Firm* — Duane Morris LLP

(57) ABSTRACT

A multi-patterning method includes: patterning at least two first openings in a hard mask layer over a substrate using a first mask; forming spacers within two of the at least two first openings, each spacer having a spacer opening therein for patterning a respective first circuit pattern over the substrate, wherein each spacer defines a pattern-free region adjacent to a respective one of the at least two first circuit patterns, and patterning a second circuit pattern in the hard mask layer using a second mask. The second circuit pattern is located between and excluded from the pattern free regions adjacent the at least two first circuit patterns.

25 Claims, 9 Drawing Sheets

(56) References Cited

U.S. PATENT DOCUMENTS

| | | | |
|---|---|---|---|
| 2009/0311861 A1* | 12/2009 | Park | H01L 21/0337 438/689 |
| 2010/0055621 A1* | 3/2010 | Hatakeyama | H01L 21/0275 430/323 |
| 2010/0203734 A1* | 8/2010 | Shieh | H01L 21/3086 438/706 |
| 2010/0221919 A1* | 9/2010 | Lee | H01L 21/0337 438/694 |
| 2010/0327396 A1* | 12/2010 | Park | H01L 27/0207 257/506 |
| 2012/0289039 A1* | 11/2012 | Kajiwara | H01L 27/11519 438/588 |
| 2013/0260557 A1* | 10/2013 | Wang | H01L 21/0337 438/669 |
| 2013/0307166 A1 | 11/2013 | Doebler et al. | |
| 2014/0193974 A1* | 7/2014 | Lee | H01L 21/76816 438/669 |

\* cited by examiner

MULTI-PATTERNING METHOD AND DEVICE FORMED BY THE METHOD

This application is a division of U.S. patent application Ser. No. 13/737,192, filed Jan. 9, 2013, which is expressly incorporated by reference herein in its entirety.

BACKGROUND

This disclosure relates to semiconductor fabrication generally, and more specifically to methods for multi-patterning a layer of an integrated circuit (IC).

In semiconductor fabrication processes, the resolution of a photoresist pattern begins to blur at about 45 nanometer (nm) half pitch. To continue to use fabrication equipment purchased for larger technology nodes, multi-exposure methods have been developed.

Multiple exposure or multi-patterning technology (MPT) involves forming patterns on a single layer of a substrate using two or more different masks in succession. If only two masks are used for patterning a layer, the technique is referred to as double exposure. One form of double exposure is referred to as double patterning technology (DPT). In DPT, first and second masks are used sequentially to pattern the same layer. As long as the patterns within each mask comply with the relevant minimum separation distances for the technology node, the combination of patterns formed using both masks may include smaller spacings than the minimum separation distance.

In a litho-etch-litho-etch (LELE) DPT approach, the space between adjacent metal patterns is defined by multiple etch after-etch-inspection critical dimension and a pattern-to-pattern overlay shift. If there is any mask alignment error, the patterns formed by the second photomask are shifted relative to the patterns formed by the first photomask. A pattern formed by the second photomask can be closer to, or further from, a given pattern formed by the first photomask, causing the parasitic resistance-capacitance (RC) coupling between the patterns to differ from the couplings computed by RC extraction, which are used for timing analysis.

DETAILED DESCRIPTION

Figure 1A:
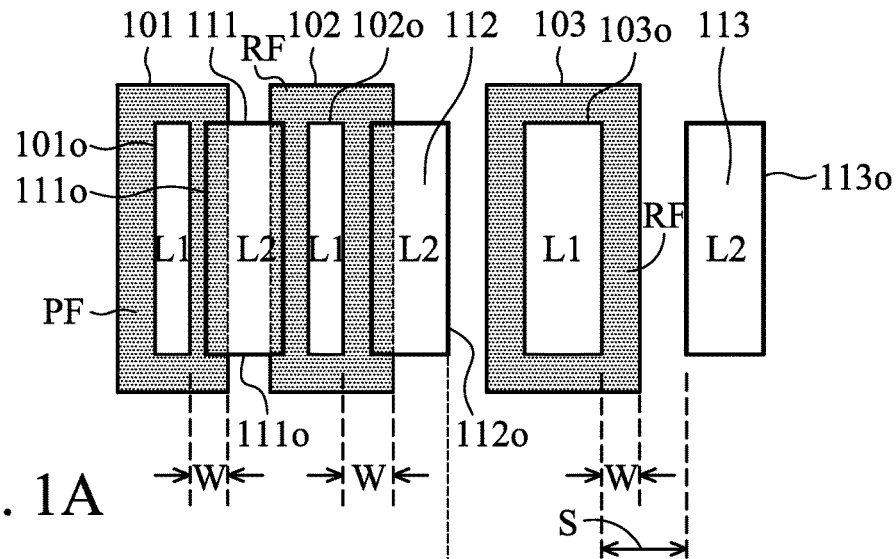
FIG. 1A is a plan view of a set of properly aligned circuit patterns formed by multi-patterning according to an example of the method.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Methods are described herein for maintaining a desired minimum inter-pattern spacing in an IC layer patterned by DPT, regardless of the presence or absence of an overlay error (misalignment) between patterns formed by a first photomask on a layer and a second photomask used to pattern the same layer. FIGS. 1A-1D are schematic diagrams showing a self-aligned litho-etch-litho-etch multi-patterning method and a layer of an IC patterned by the method.

Figure 1B:
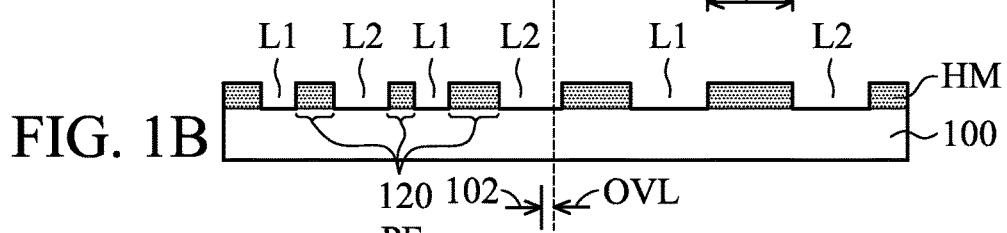
FIG. 1B is a side cross sectional view of the set of circuit patterns of FIG. 1A.
Figure 2A:
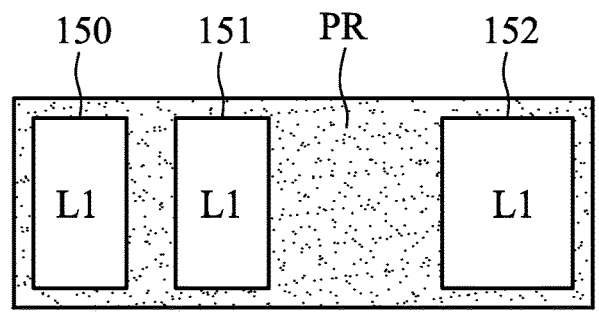
FIG. 2A is a plan view of a first photoresist layer for patterning a first set of circuit patterns (L1) on a layer above a substrate.

Referring first to FIGS. 1A and 1B, in some embodiments of the multi-patterning method, at least two first openings L1 are patterned in a hard mask layer HM over a substrate 100 using a first mask (shown in FIG. 2A). At least one second opening L2 is patterned in the hard mask layer HM over a substrate 100 using a second photomask (shown in FIG. 6A). A distance between at least one of the second circuit patterns L2 and at least one of the at least two first circuit patterns L1 is less than a minimum spacing between two lines to be clearly patterned using a single mask, so that DPT is appropriate.

Referring again to FIGS. 1A and 1B, a plurality of spacers 101-103 are formed within two of the at least two first openings L1. Each spacer 101-103 has a spacer opening 101o-103o therein for patterning a respective first circuit pattern L1 over the substrate 100. Each spacer 101-103 defines a pattern-free region PF adjacent to a respective one of the first circuit patterns L1. The pattern free regions PF have a width W. The spacers 101-103 are self-aligned with the first circuit patterns L1, as described in the discussion of FIGS. 2A to 9B.

A second circuit pattern L2 is patterned in the same hard mask layer using a second photomask, such that the second circuit pattern L2 is located between and excluded from the pattern free regions PF adjacent the two first circuit patterns L1. The openings 111o-113o in the second photomask can overlap with the pattern free regions PF, so that outline of the openings 111o-113o for the second circuit patterns L2, shown by solid lines in FIG. 1A, can overlap with the pattern free regions PF. However, the openings in hard mask HM corresponding to the second circuit patterns L2 do not extend into the pattern free regions PF. Thus, as indicated by the dashed lines connecting FIG. 1A and FIG. 1B, the L2 openings in the hard mask HM extend between the edges of the pattern free regions PF. The self-aligned spacers 101-103 maintain a desired minimum spacing W between adjacent patterns formed by two different photomasks, regardless of any overlay error OVL (misalignment) between the second photomask and the first circuit patterns L1 during the patterning of the second circuit patterns L2. Thus, in FIG. 1B, three of the spacings 120 are set at the minimum spacing W, as defined by the pattern free regions PF adjacent the openings 101o and 102o.

Figure 1C:
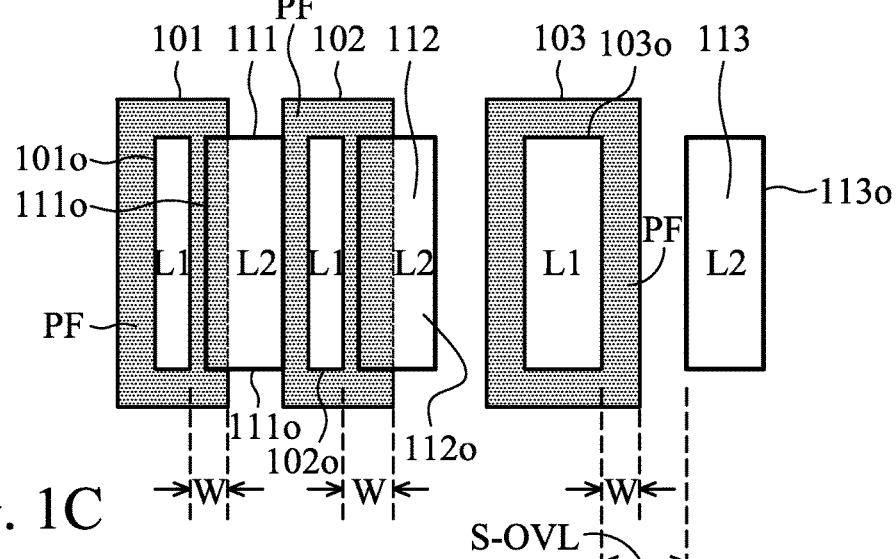
FIGS. 1C and 1D show the set of circuit patterns of FIGS. 1A and 1B in the case of an overlay error (mask misalignment).

FIG. 1C shows the same IC layer as shown in FIG. 1, as it would appear if there is an overlay error OVL between the second photomask and the first circuit patterns L1 during the patterning of the second circuit patterns L2. The dashed line connecting FIGS. 1A and 1C shows how the misalignment error results in a displacement OVL of the second photomask relative to the patterns formed by the first photomask. As shown in the cross sectional view of FIG. 1C, the overlay error OVL causes each second circuit opening 111o-113o in the second photomask to be closer to the adjacent first circuit pattern L1 on the left by OVL, and further from the adjacent first circuit pattern L1 on the right by OVL.

However, because the hard mask HM material is removed in the portion of the openings 102o outside of the pattern free regions PF (but is not removed from the pattern-free region PF), and the pattern free regions PF are self-aligned with the patterns L1, the overlay shift OVL in the photomask openings 111o-113o does not cause a shift in the boundary of those second circuit patterns 111-112 defined by the pattern free regions. That is, the left and right side edges of second circuit pattern 111 is defined by the pattern free regions PF adjacent thereto; and the left edge of second circuit pattern 112 is defined by the pattern free region PF adjacent thereto. These edges do not shift, even if an overlay shift occurs. The second circuit pattern 113 is at a distance greater than OVL from the nearest pattern free region PF, so that the pattern free regions PF do not define the edges of the second circuit pattern 113, regardless of overlay error.

Figure 1D:
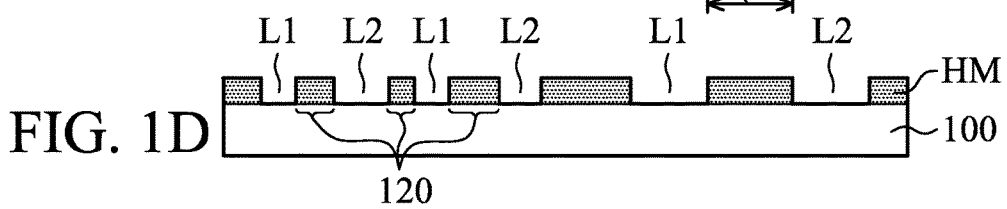

FIG. 1D shows the resulting hard mask layer HM in the case where an overlay shift is present. The desired minimum separation W between adjacent L1 and L2 patterns is maintained, as determined by the width W of the pattern free regions PF. Thus, even in the presence of overlay shift OVL, three of the spacings 120 are set at the minimum spacing W, as defined by the pattern free regions PF adjacent the openings 101o and 102o. By way of comparison, the second circuit pattern 113 is defined by an opening 113o, which is separated from the nearest pattern 103c by a distance greater than OVL+W, and separated from the nearest spacer by a distance greater than OVL. In the correctly aligned case of FIGS. 1A and 1B, there is a spacing S between L1 pattern opening 103o and the L2 pattern 113 (where S>OVL+W). In the case of FIGS. 1C and 1D, the overlay shift causes the pattern 113 to move closer to the nearest pattern opening 103o. The spacing between L1 pattern opening 103o and the L2 pattern 113 is reduced to S-OVL. This distance is sufficiently large that the parasitic coupling between the L1 pattern to be formed in opening 103o and the L2 pattern 113 is relatively small, and the deviation in the parasitic coupling (from the original design) caused by the overlay shift is very small.

Thus, for a given width W of spacers 101-103, the circuit patterns which are closest to each other after double patterning a substrate have a well-controlled spacing, resulting in a predictable parasitic capacitive coupling, regardless of overlay shift. These are also the patterns which can have the highest parasitic capacitance, because the capacitive coupling is inversely proportional to the distance between the patterns. Pairs of patterns having a spacing of at least W+OVL in the original design (where OVL is the largest expected overlay shift) can have their spacing changed by an overlay shift, but the deviation in parasitic capacitive coupling is sufficiently small that such deviation is deemed to not substantially affect timing.

Thus, a layer is formed by DPT, in which the first circuit patterns L1 and second circuit patterns L2 have locations defined by a design layout, wherein: at least one 111 of the second circuit patterns L2 is separated from an adjacent one of the first circuit patterns 101o, 102o by a distance that does not deviate from the design layout, regardless of an overlay error between the second photomask and the first circuit pattern; and at least another one 113 of the second circuit patterns L2 is separated from an adjacent one 103o of the first circuit patterns L1 by a distance that deviates from the design layout because of the overlay error.

Figure 10:
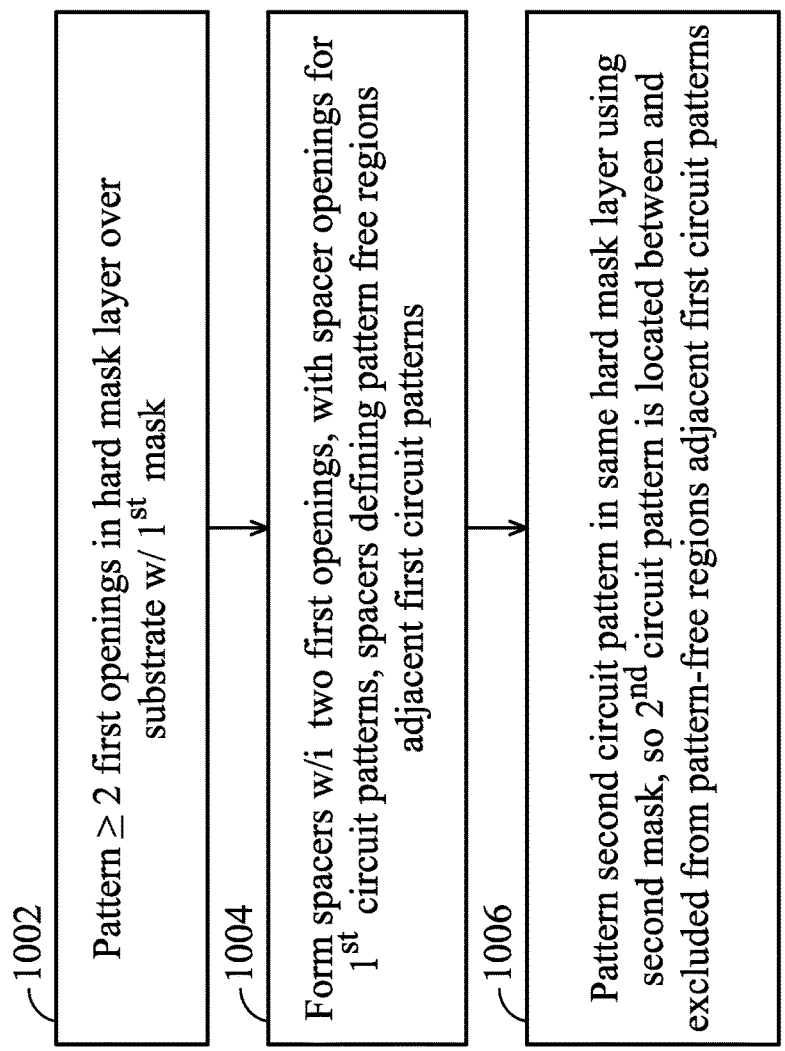
FIG. 10 is a flow chart of an embodiment of a double patterning method using the spacers shown in FIGS. 5A and 5B.

FIG. 10 is a flow chart of an example of a method.

At step 1002, two or more first openings are formed in a hard mask layer over a substrate, using a first photomask. These openings are larger than the circuit patterns that are to be formed on the substrate. For example, if a circuit pattern is to have a line width LW and a minimum distance W from a nearest adjacent circuit pattern, then the opening width is LW+2W.

At step 1004, spacers 101-103 are formed within each of the two or more first openings. An outer perimeter of each spacer 101-103 is defined by the openings of the first photomask. Each spacer 101-103 has an opening 101o to 103o for patterning a respective first circuit pattern. The spacers 101-103 define pattern free regions PF adjacent to the first circuit patterns.

At step 1006, one or more second circuit patterns are formed in the same hard mask layer using a second photomask. The second circuit pattern(s) include a second circuit pattern located between and excluded from the pattern free regions PF adjacent to the first circuit pattern.

Figure 11:
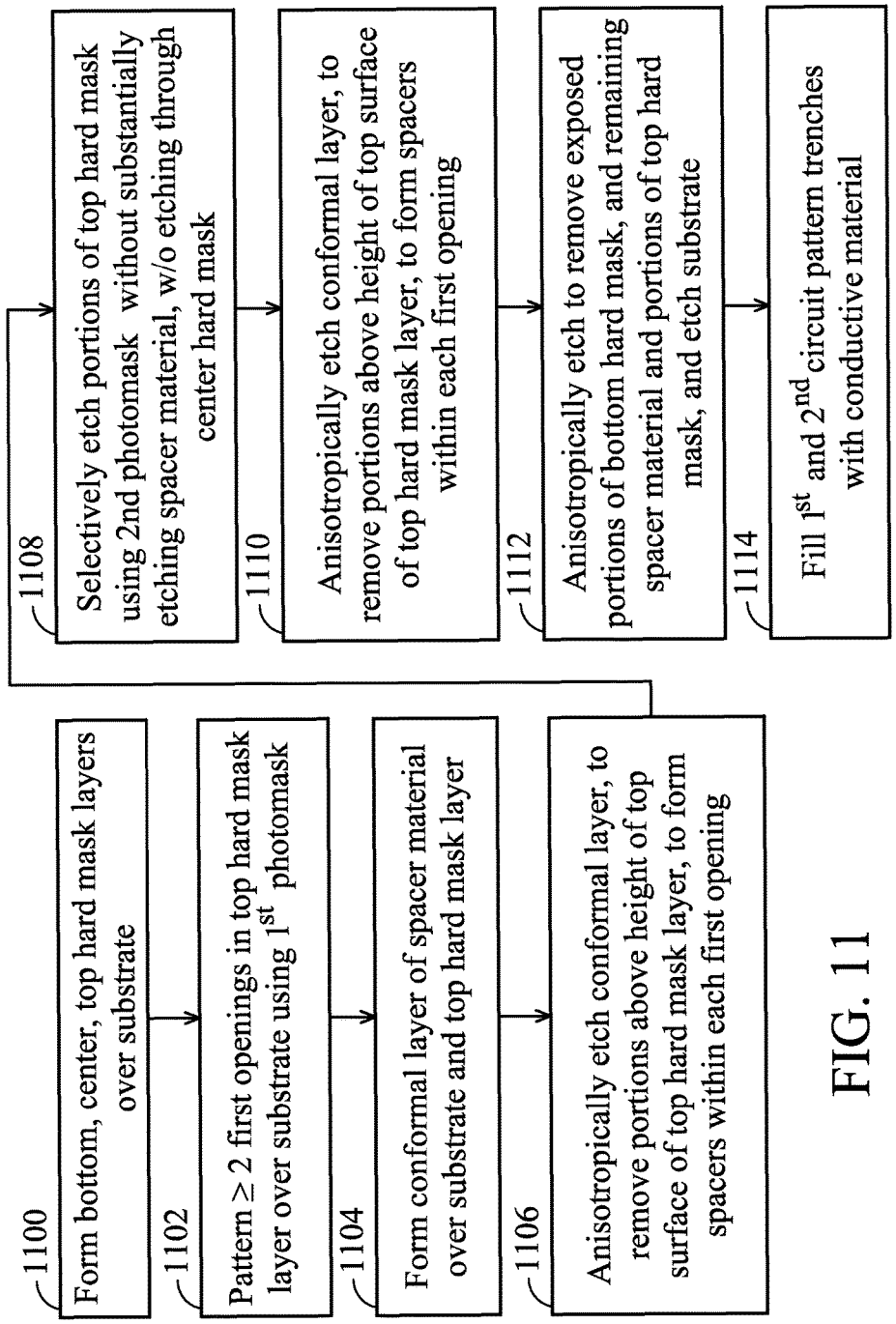
FIG. 11 is a detailed flow chart of an embodiment of the method of FIG. 10.

FIGS. 2A-9B show details of method according to some embodiments. FIG. 11 is a flow chart of this method. For ease of understanding, all of the openings and circuit patterns that are patterned using a first photomask are commonly referred to herein with the designation L1, and all of the openings and circuit patterns that are patterned using a second photomask are commonly referred to with the designation L2. It is also noted that the number and location of the L2 patterns in FIGS. 2A-9B differs from FIGS. 1A-1D for ease of illustration. The method is not limited to any specific location of the patterns.

At step 1100 of FIG. 11, bottom HM1, center HM2 and top HM3 hard mask layers are formed above a substrate. The substrate 100 can be a bulk semiconductor material (e.g., silicon), on which active and/or passive devices are formed, and above which a plurality of inter-metal dielectric (IMD) layers are formed. The IMD layers can be formed of a material such as low-k (LK) dielectric, extreme low-k (ELK) dielectric, ultra low-k (ULK) dielectric, a glass, such as phosphosilicate glass (PSG), undoped silicate glass (USG), silicon or other semiconductor material. The dielectric material of substrate 100 can be formed over a semiconductor substrate by, for example, chemical vapor deposition (CVD) or plasma enhanced CVD (PECVD).

The hard mask layer HM has three component layers, HM1, HM2, and HM3. The hard mask layers are chosen to permit etching of the HM3 layer without etching through the HM2 layer, and to allow selective etching of the HM2 layer without etching through the HM1 layer. In some embodiments, the HM1 layer comprises a metal, such as a metal selected from the group consisting of Ti, TiN, Ta, or TaN, deposited by physical vapor deposition (PVD), CVD, PECVD, or atomic layer deposition (ALD). In some embodiments, the HM2 layer comprises SiO, SiON, or SiN, deposited by CVD, PECVD or ALD. In some embodiments, the HM3 layer comprises SiO, SiON, or SiN, deposited by CVD, PECVD or ALD.

A photoresist layer PR is formed over the top hard mask layer HM3. In some embodiments, the photoresist layer PR includes a photoresist and a bottom anti-reflective coating (BARC), a photoresist with silicon content, or a BARC with spin on carbon. In some embodiments, the photoresist layer PR is formed by spin coating.

Figure 2B:
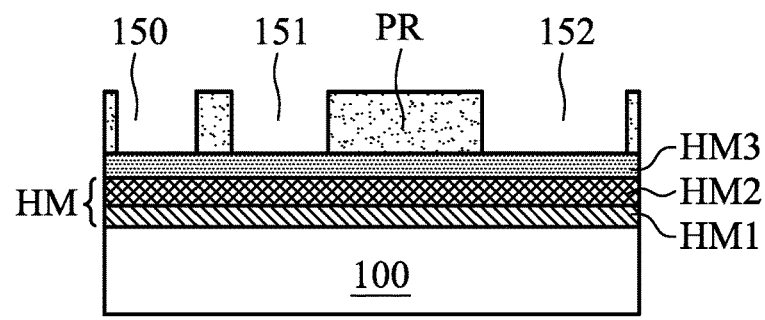
FIG. 2B is a side cross sectional view of the substrate having the photoresist layer of FIG. 2A on it.
Figure 3A:
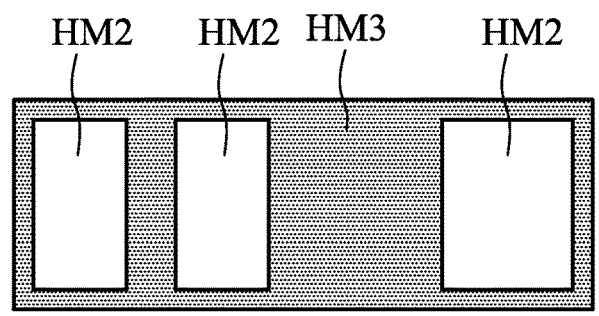
FIG. 3A is a plan view of the substrate of FIG. 2B, after etching the top hard mask layer.
Figure 3B:
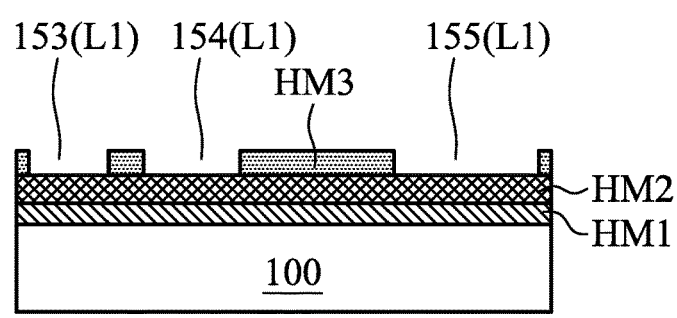
FIG. 3B is a side cross sectional view of the substrate of FIG. 2B, after etching the top hard mask layer.

At step 1102 of FIG. 11, at least two first openings 150-152 are patterned in a hard mask layer HM3 over the substrate 100 using a first photomask (not shown). FIG. 2A is a top plan view showing the patterned photoresist PR with three L1 first openings 150-152. FIG. 2B is a side cross sectional view showing the substrate 100 with the hard mask layers HM1-HM3 and patterned photoresist layer PR. As noted above, the width of the L1 openings 150-152 is greater than the width of the L1 circuit patterns to be formed on the substrate by a dimension 2W, where W is the width of the spacer patterns 101-103. Although FIGS. 2A-2B only show three of the L1 openings formed by the first photomask, any non-zero number of first openings can be patterned in the photoresist PR using the first photomask.

The substrate is then etched anisotropically (e.g., by a dry etch, such as plasma etching) to pattern the hard mask layer HM3 within the L1 openings 153-155 and to remove the remaining portions of the photoresist layer PR. The plasma etching can use a plasma of reactive gases such as fluorocarbons, oxygen, chlorine, boron trichloride, optionally with nitrogen, argon, helium or other gas. The resulting configuration is shown by the top plan view of FIG. 3A and cross sectional view of FIG. 3B.

Figure 4:
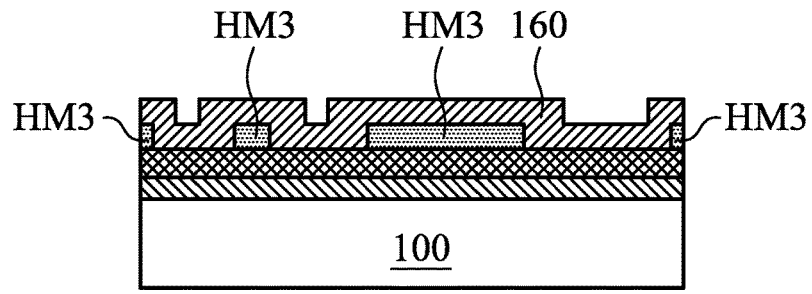
FIG. 4 is a side cross sectional view of the substrate of FIG. 3B, after deposition of a conformal layer.
Figure 5A:
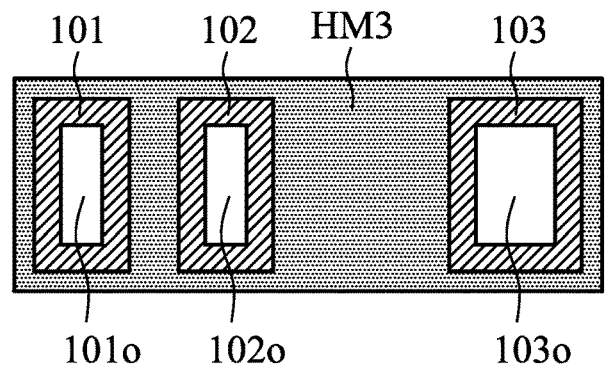
FIGS. 5A and 5B are plan and cross sectional views, respectively, showing the substrate after etching the conformal layer, to form spacers.
Figure 5B:
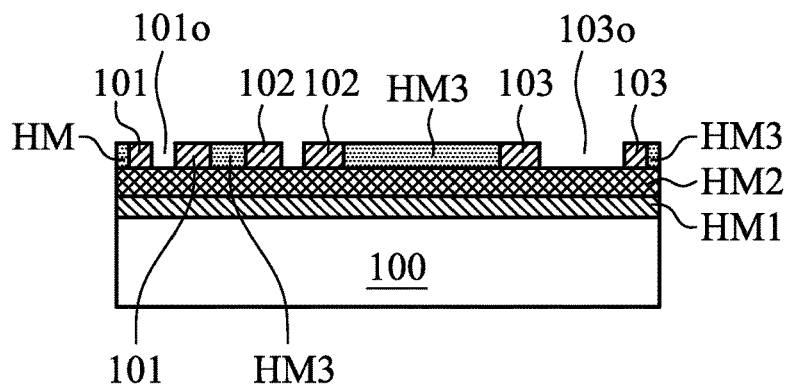

At step 1104 of FIG. 11, a conformal layer 160 of a spacer material is formed over the substrate 100 and hard mask layer HM. In some embodiments, the conformal material is a metal, such as Ti, Ta, TaN, TiO, TiN, or TaN, deposited by ALD or CVD. FIG. 4 is a cross-sectional view showing the substrate with the conformal layer 160 formed over the top hard mask layer HM3 and the exposed portions of the center hard mask layer HM2. The thickness of the conformal layer 160 is about the thickness of the hard mask layer HM3. Alternatively, the conformal layer 160 can be thicker than the hard mask layer HM3.

At step 1106 of FIG. 11, the conformal layer 160 is anisotropically etched (e.g., plasma etching), to remove portions of the conformal layer above a height of a top surface of the hard mask layer HM3, so as to form spacers 101-103 within each of the at least two first openings 153-155. The spacer material in the center of each spacer is etched by the anisotropic etch to form a respective opening 101o, 102o, 103o corresponding to a respective first circuit pattern L1. Each spacer 101-103 has a spacer opening 101o-103o therein. The openings 101o-103o are to be used for forming respective first circuit patterns L1 over the substrate 100. The openings 101o-103o for the L1 patterns correspond in size to the patterns in the original IC design. Each spacer 101-103 comprises the spacer material (i.e., the material of the conformal coating 160) defining a pattern-free region PF adjacent to a respective one of the first circuit patterns L1. The spacers 101-103 are shown in top plan view in FIG. 5A and in cross sectional view in FIG. 5B.

Figure 6A:
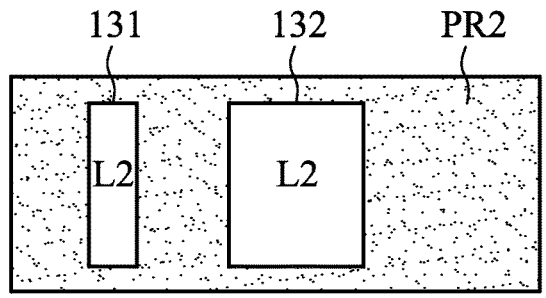
FIG. 6A is a plan view of a second photoresist layer for patterning a second set of circuit patterns (L2) in the top hard mask layer, with proper alignment.
Figure 6B:
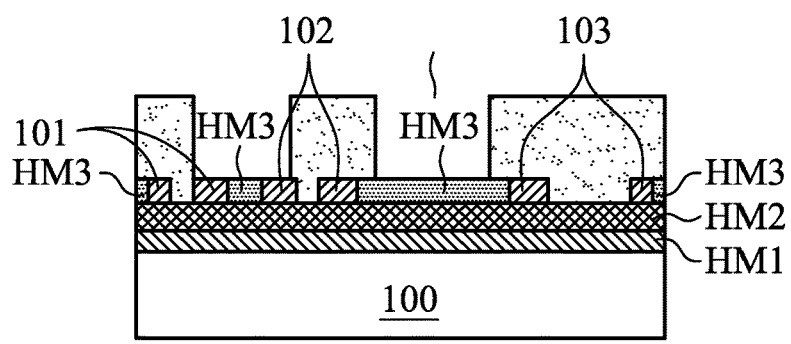
FIG. 6B is a side cross sectional view of the substrate of FIG. 6A.
Figure 6C:
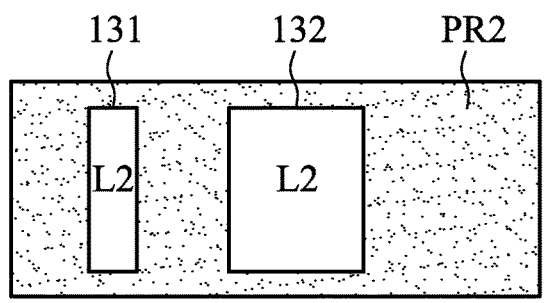
FIGS. 6C, and 6D are top plan and side cross section views, respectively, of the photoresist layer and substrate, in the case of an overlay error (misalignment) between the second photomask and the patterns formed by the first photomask.
Figure 6D:
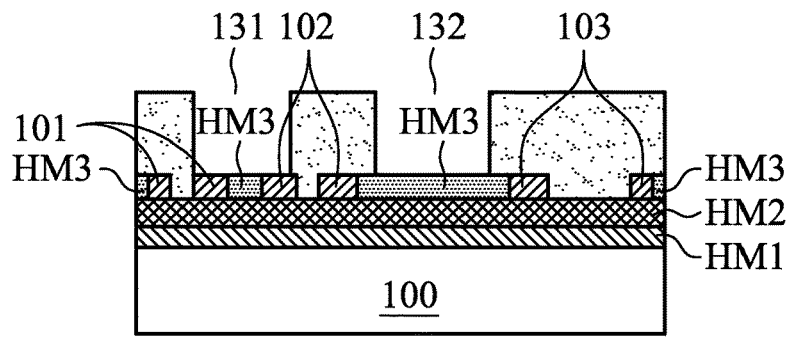

At step 1108 of FIG. 11, portions of the hard mask HM3 are selectively etched without substantially etching the material of spacers 101-103. This forms at least one second circuit pattern trench L2 in the same hard mask layer HM3 using a second photomask PR2. This step 1108 includes the following:

The second photoresist layer PR2 is applied over the spacers 101-103 and the exposed surfaces of the hard masks HM2 and HM3. The second photoresist layer PR2 is exposed using a second photomask, and the photoresist is removed from the L2 regions 131, 132. FIG. 6A shows the photoresist PR2 after the exposure, and FIG. 6B is a cross sectional view of the substrate with the remaining portions of the second photoresist layer outside the L2 regions 131, 132. FIGS. 6C and 6D show the substrate of FIGS. 6A and 6B using the same IC design, in the case where there is an overlay shift (misalignment) between the L2 windows 131, 132 and the spacers 101-103.

The substrate 100 is then etched anisotropically. In this step, the selectivity of the HM3 material to the spacer material can be at least two, so that the remaining second photoresist layer PR2 and the exposed portions of the top mask layer HM3 (within the L2 windows 131, 132) are removed without substantially etching the spacer material, and without etching through the center hard mask HM2. so that the spacers 101-103 substantially remain. That is, the portions of the spacer material exposed to this etching step are not substantially removed.

Figure 7A:
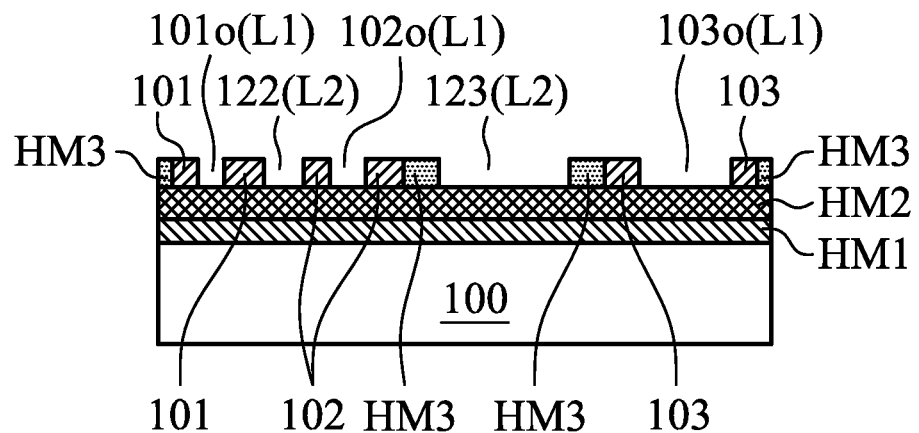
FIG. 7A shows the substrate of FIG. 6B, after the second etch of the top hard mask layer.

FIG. 7A shows the substrate at the conclusion of this etch. The three spacers 101-103 and their center openings 101o-103o are exposed. In addition, the L2 openings 122, 123 are formed. In the case of L2 opening 122, the L2 window 131 in the photoresist overlaps the pattern free regions PF defined by the spacers 101 and 102. The opening 122 is thus defined by the region between the spacers 101 and 102, and is smaller than the L2 window 131. The second circuit pattern trench 122 is located between and excluded from the pattern free regions PF adjacent the two first circuit patterns L1. On the other hand, the L2 window 132 does not overlap either of the pattern free regions defined by spacers 102 or 103. Thus, the opening 123 is defined by the L2 window 132, and is substantially the same size as the L2 window 132 (where any deviations in the width of L2 pattern 123 are caused by process variation, and not by mask overlay shift).

Figure 7B:
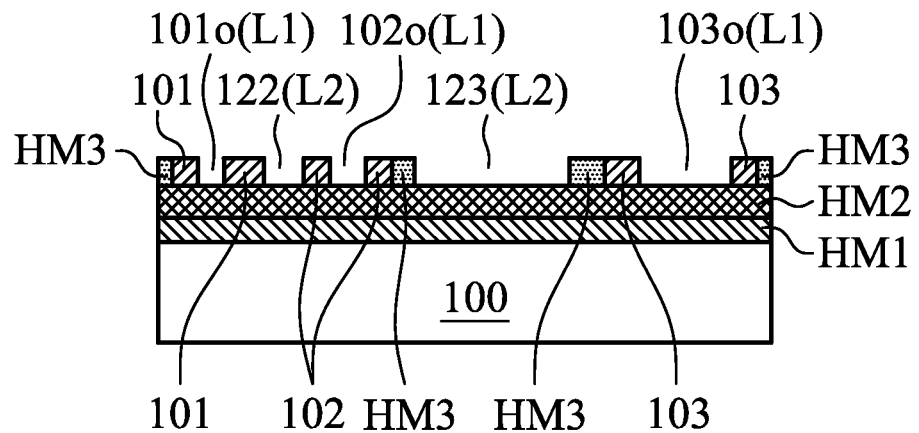
FIG. 7B shows the substrate of FIG. 6D after the second etch of the top hard mask layer in the case of an overlay error (misalignment) between the second photomask and the patterns formed by the first photomask.

FIG. 7B shows the substrate 100 formed using the same IC design and photomasks at the conclusion of step 1008, in the case where there is an overlay shift. A comparison of FIG. 7B to FIG. 7A shows that in the overlay shift case of FIG. 7B, the portion of hard mask HM3 to the left of window 123 is narrower than design, and the portion of hard mask HM3 to the right of window 123 is wider than design. Nevertheless, the spacers 101 and 102 have the same dimensions and locations in FIGS. 7A and 7B, since they are self-aligned with the openings formed by the first photomask. The distance between the at least two first openings 150, 151 in the hard mask layer HM3 is a line width of the second circuit pattern 122. Thus, the minimum spacing between the L1 and L2 patterns formed by the 101o, 122 and 102 openings is the same in FIG. 7B as in 7A, regardless of the overlay shift.

At step 111o of FIG. 11, exposed portions of the center hard mask HM2 are anisotropically etched through, without etching through the bottom hard mask HM1 or the remaining spacer material of spacers 101-103 or remaining portions of the top hard mask HM3. The L1 openings 161, 163 and 165 and L2 openings 162 and 164 are all shown. The configuration after this etching step is shown in plan view in FIG. 8A and in cross sectional view in FIG. 8B.

Figure 8A:
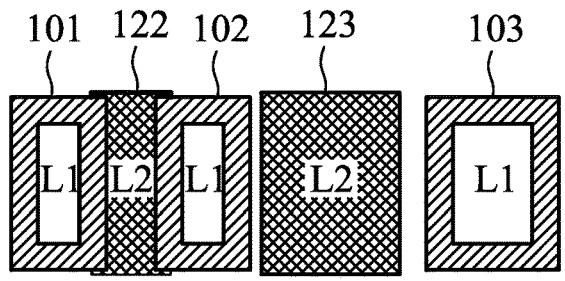
FIG. 8A is a top plan view showing the second (L2) patterns properly aligned relative to the first (L1) patterns of FIGS. 5A and 5B.
Figure 8B:
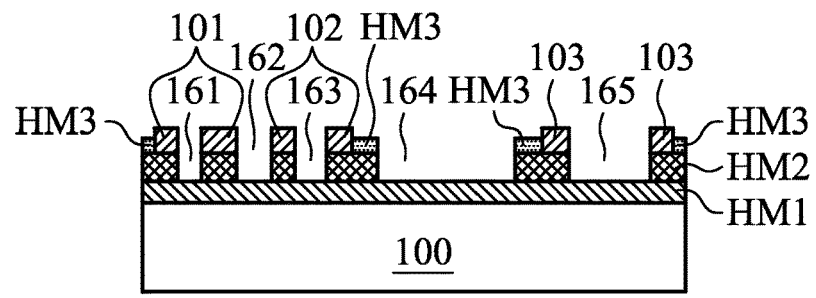
FIG. 8B is a cross sectional view of the substrate of FIG. 7B, after selectively etching the center hard mask layer in the first (L1) and second (L2) pattern regions.
Figure 8C:
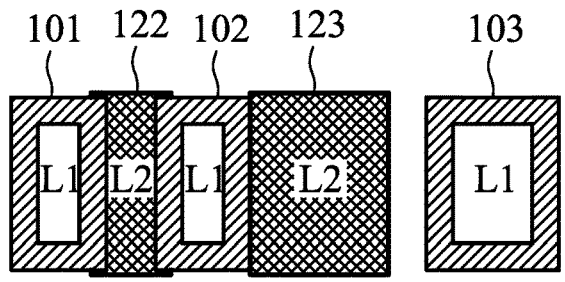
FIG. 8C is a top plan view showing the second (L2) patterns having an overlay error relative to the first (L1) patterns of FIGS. 5A and 5B.
Figure 8D:
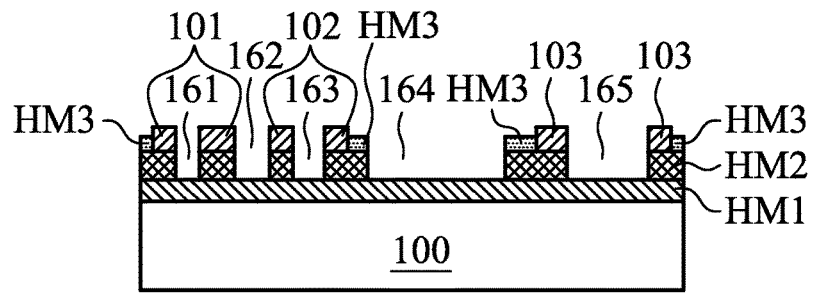
FIG. 8D is a cross sectional view of the substrate of FIG. 7D (in the presence of an overlay error), after selectively etching the center hard mask layer in the first (L1) and second (L2) pattern regions.

FIGS. 8C and 8D show a substrate formed by the same IC design and process as FIGS. 8A and 8B, except that in FIGS. 8C and 8D, the L2 opening 164 is shifted relative to as a result of the L1 patterns 161-163, 165, due to the overlay shift. Thus, a first one 164 of the second circuit patterns is located with a position error relative to an adjacent first pattern due to the overlay error; and a second one 162 of the second circuit patterns is located without a position error relative to the adjacent first pattern, regardless of the overlay error.

At step 1112 of FIG. 11, the substrate is anisotropically etched to remove exposed portions of the bottom hard mask HM1, and the spacers 101-103 and portions of the top hard mask HM3. Only the substrate 100 with the patterned hard mask layers HM1 and HM2 remain, defining the L1 openings 171, 173 and 175 and the L2 openings 172 and 174. In some embodiments, in order to remove the spacer material and HM1 material, a plasma dry etching process such as a reactive ion etch (RIE) process is used. The resulting structure is shown in FIG. 9A (cross section).

Figure 9A:
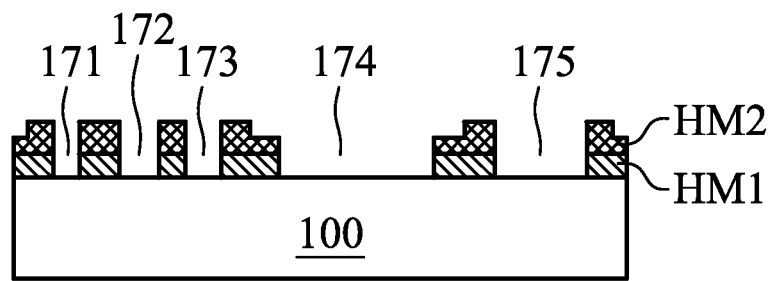
FIG. 9A is a cross sectional view of the substrate of FIG. 8B, after etching to remove the remaining portions of the top hard mask layer and spacer layer, and remove portions of the bottom hard mask layer corresponding to the first and second circuit patterns.
Figure 9B:
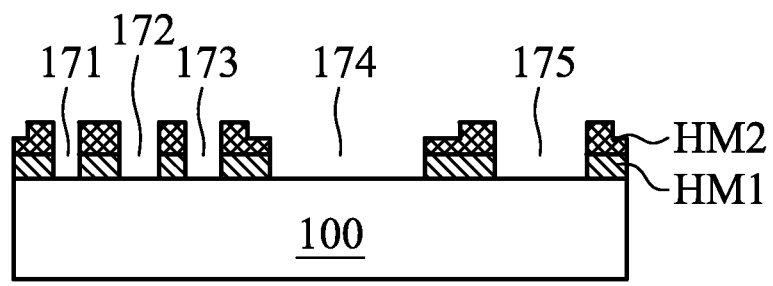
FIG. 9B is a cross sectional view of the substrate of FIG. 8D, after etching to remove the remaining portions of the top hard mask layer and spacer layer, and remove portions of the bottom hard mask layer corresponding to the first and second circuit patterns in the case of an overlay error (misalignment).

FIG. 9B shows a substrate formed by the same IC design and process as FIG. 9A except that in FIG. 9B, the L2 opening 174 is shifted relative to as a result of the L1 patterns 171-167, 175, due to the overlay shift.

In step 1114 of FIG. 11, the openings 171-175 (first and second circuit pattern trenches) can be filled with a conductive material to form conductive lines.

In some embodiments, a multi-patterning method comprises: patterning at least two first openings in a hard mask layer over a substrate using a first mask; forming spacers within two of the at least two first openings, each spacer having a spacer opening therein for patterning a respective first circuit pattern over the substrate, wherein each spacer defines a pattern-free region adjacent to a respective one of the at least two first circuit patterns, and patterning a second circuit pattern in the hard mask layer using a second mask, wherein the second circuit pattern is located between and excluded from the pattern free regions adjacent the at least two first circuit patterns.

In some embodiments, a multi-patterning method comprises: patterning at least two first openings in a hard mask layer over a substrate using a first mask; forming a conformal layer of a spacer material over the substrate and the hard mask layer; anisotropically etching the conformal layer, to remove portions of the conformal layer above a height of a top surface of the hard mask layer, to form spacers within each of the at least two first openings, each spacer having a spacer opening therein for forming a respective first circuit pattern over the substrate, wherein each spacer comprises the spacer material defining a pattern-free region adjacent to a respective one of the at least two first circuit patterns, and selectively etching portions of the hard mask without substantially etching the spacer material, for forming a second circuit pattern trench in the hard mask layer using a second mask, wherein the second circuit pattern trench is located between and excluded from the pattern free regions adjacent the at least two first circuit patterns.

In some embodiments, a method, comprises: forming a plurality of spacers in a hard mask layer above a semiconductor substrate, each spacer having a perimeter defined using a first photomask, and an interior opening defining a first circuit pattern; and patterning the hard mask layer using a second photomask for forming at least one second circuit pattern between two of the plurality of spacers, wherein the spacers have a width defining a minimum distance between the second circuit pattern and any of the first circuit patterns.

Although the subject matter has been described in terms of exemplary embodiments, it is not limited thereto. Rather, the appended claims should be construed broadly, to include other variants and embodiments, which may be made by those skilled in the art.

What is claimed is:

1. A method, comprising:
   forming a plurality of spacers in a hard mask layer above a semiconductor substrate, each spacer having a perimeter defined using a first photomask, and an interior opening defining a first circuit pattern, wherein the plurality of spacers comprises a first spacer having a first opening and a second spacer having a second opening, the first and second openings defining at least a portion of the first circuit pattern; and
   patterning the hard mask layer using a second photomask to form a third opening disposed between the first and second openings and a fourth opening, wherein the second opening is disposed between the third and fourth openings, wherein the third and fourth openings define at least a portion of a second circuit pattern, wherein a distance between the second opening and the fourth opening deviates due to an overlay error between the first photomask and the second photomask while respective distances between the first, second and third openings do not deviate due to the overlay error.

2. The method of claim 1, wherein the spacer forming step includes:
   forming a conformal layer of a spacer material over the substrate and the hard mask layer; and etching the conformal layer, to remove portions of the conformal layer above a height of a top surface of the hard mask layer.

3. The method of claim 1, wherein the distance between the second and fourth openings is greater than a width of the spacers.

4. The method of claim 3, wherein the distance between the second and fourth openings is greater than a sum of the width of the spacers plus a distance corresponding to a size of the overlay error.

5. The method of claim 1, wherein the step of forming a plurality of spacers includes:
   depositing a conformal layer of a spacer material inside the first and second openings and over remaining portions of the hard mask layer outside the first and second openings; and
   etching the conformal layer, to remove portions of the conformal layer outside the first and second openings.

6. The method of claim 5, wherein the etching step removes additional portions of the conformal layer to form the first and second openings.

7. The method of claim 1, further comprising depositing the hard mask layer prior to the step of forming the plurality of spacers, wherein:
   the hard mask layer includes a first hard mask layer, a second hard mask layer and a third hard mask layer;
   the patterning step includes etching the third hard mask layer without etching through the second hard mask layer; and
   the patterning step further includes selectively etching the second hard mask layer without etching the first hard mask layer.

8. The method of claim 7, wherein the first hard mask layer comprises a metal, the second hard mask layer comprises an oxide or a nitride over the first hard mask layer, and the third hard mask layer comprises an oxide or a nitride over the second hard mask layer.

9. The method of claim 7, wherein the first hard mask layer includes Ti, TiN, Ta, or TaN, deposited by physical vapor deposition, chemical vapor deposition (CVD), plasma enhanced chemical vapor deposition (PECVD), or atomic layer deposition (ALD).

10. The method of claim 9, wherein:
    the second hard mask layer includes SiO, SiON, or SiN, deposited by CVD, PECVD or ALD; and
    the third hard mask layer includes SiO, SiON, or SiN, deposited by CVD, PECVD or ALD.

11. The method of claim 1, wherein the step of patterning the hard mask layer uses the second photomask for forming a plurality of second circuit patterns between respective pairs of adjacent spacers, such that a respective distance between each second circuit pattern and its adjacent first circuit pattern is equal to or greater than a width of the spacers.

12. The method of claim 11, wherein:
    the first circuit patterns and second circuit patterns have locations defined by a design layout,
    at least a first one of the second circuit patterns is separated from one of the first circuit patterns adjacent to the second one of the second circuit patterns by a first distance that deviates from a corresponding distance in the design layout because of an overlay error; and
    at least a second one of the second circuit patterns is separated from an adjacent one of the first circuit patterns by a second distance that does not deviate from a corresponding distance in the design layout.

13. The method of claim 11, wherein the first distance is greater than or equal to a sum of the width of the spacers plus a distance corresponding to a size of the overlay error; and
    the second distance is less than a sum of the width of the spacers plus a distance corresponding to the size of the overlay error.

14. The method of claim 11, further comprising depositing the hard mask layer prior to the step of forming the plurality of spacers, wherein:
    the hard mask layer includes a first hard mask layer comprising metal, a second hard mask layer comprising an oxide or a nitride over the first hard mask layer, and a third hard mask layer comprising an oxide or a nitride over the second hard mask layer; and
    the patterning step includes:
    etching the third hard mask layer without etching through the second hard mask layer; and
    selectively etching the second hard mask layer without etching the first hard mask layer.

15. The method of claim 1, further comprising:
    forming a plurality of first openings in the hard mask above the semiconductor substrate using a third photomask before forming the plurality of spacers,
    wherein the step of forming the plurality of spacers forms the spacers in the first openings; and
    the second photomask has second openings for forming the at least one second circuit pattern between two of the plurality of spacers, wherein at least one of the second openings is wider than a distance between the two of the plurality of spacers, between which the second circuit pattern corresponding to that second opening is to be formed.

16. The method of claim 15, wherein:
    the first circuit patterns and second circuit patterns have locations defined by a design layout,
    at least a first one of the second circuit patterns is separated from one of the first circuit patterns adjacent to the second one of the second circuit patterns by a first distance that deviates from a corresponding distance in the design layout because of an overlay error; and
    at least a second one of the second circuit patterns is separated from an adjacent one of the first circuit patterns by a second distance that does not deviate from a corresponding distance in the design layout.

17. The method of claim 16, wherein the first distance is greater than or equal to a sum of the width of the spacers plus a distance corresponding to a size of the overlay error; and
    the second distance is less than a sum of a width of the spacers plus a distance corresponding to the size of the overlay error.

18. The method of claim 15, further comprising depositing the hard mask layer prior to the step of forming the plurality of spacers, wherein:
    the hard mask layer includes a first hard mask layer comprising metal, a second hard mask layer comprising an oxide or a nitride over the first hard mask layer, and a third hard mask layer comprising an oxide or a nitride over the second hard mask layer; and
    the patterning step includes:
    etching the third hard mask layer without etching through the second hard mask layer; and
    selectively etching the second hard mask layer without etching the first hard mask layer.

19. The method of claim 1, wherein each spacer is formed continuously around the first circuit pattern in its entirety.

20. The method of claim 1, wherein the first circuit pattern and the second circuit pattern comprise a different conductive line widths.

21. The method of claim 1, wherein the first and second openings defining the first circuit pattern comprises a first circuit pattern conductive line width of the first circuit pattern.

22. A method, comprising:
forming a plurality of spacers in a hard mask layer above a semiconductor substrate, each spacer having a perimeter defined using a first photomask, and an interior opening defining a first circuit pattern, wherein the plurality of spacers comprises a first spacer having a first opening and a second spacer having a second opening, the first and second openings defining at least a portion of the first circuit pattern;

patterning the hard mask layer using a second photomask to form a third opening disposed between the first and second openings, the third opening defining at least a portion of a second circuit pattern between the first and second spacers, wherein respective distances between the first, second and third openings do not deviate with an overlay error between the first and second photomasks; and depositing conductive material within the first, second and third openings.

23. The method of claim 22, wherein the deposited conductive material is part of a conductive line and the distance between the two of the spacers is a conductive line width.

24. The method of claim 22, wherein the first and second openings defining at least a portion of the first circuit pattern each comprises a first circuit pattern conductive line width of the first circuit pattern.

25. The method of claim 22 further comprising using the second photomask to form a fourth opening further defining a portion of the second circuit pattern, wherein the second opening is disposed between the third and fourth openings, and wherein a distance between the second opening and the fourth opening deviates due to the overlay error.

* * * * *